US008422713B2

(12) United States Patent
Oxford et al.

(10) Patent No.: US 8,422,713 B2
(45) Date of Patent: Apr. 16, 2013

(54) SPHERICALLY HOUSED LOUDSPEAKER SYSTEM

(76) Inventors: J. Craig Oxford, Nashville, TN (US); D. Michael Shields, St. Paul, MN (US)

( * ) Notice: Subject to any disclaimer, the term of this patent is extended or adjusted under 35 U.S.C. 154(b) by 0 days.

(21) Appl. No.: 12/881,147

(22) Filed: Sep. 13, 2010

(65) Prior Publication Data

US 2011/0096947 A1 Apr. 28, 2011

Related U.S. Application Data

(63) Continuation of application No. 11/324,649, filed on Jan. 3, 2006, now Pat. No. 7,796,775.

(51) Int. Cl.

*H04R 1/02* (2006.01)
*H04R 25/00* (2006.01)
*H04R 9/06* (2006.01)
*H04R 1/20* (2006.01)
*H04R 11/02* (2006.01)
*H05K 5/00* (2006.01)
*A47B 81/06* (2006.01)

(52) U.S. Cl.

USPC ........... 381/345; 381/182; 381/336; 381/343; 381/347; 381/386; 381/395; 381/433; 181/145; 181/153; 181/155; 181/199

(58) Field of Classification Search .................. 381/336, 381/182, 343, 345, 347, 386, 395, 433; 181/145, 181/153, 155, 199

See application file for complete search history.

(56) References Cited

U.S. PATENT DOCUMENTS 5,253,301 A * 10/1993 Sakamoto et al. .............. 381/89
6,061,461 A * 5/2000 Paddock ....................... 381/424

FOREIGN PATENT DOCUMENTS

DE 19908631 A1 * 9/2000
WO WO 9116798 A1 * 10/1991

* cited by examiner

*Primary Examiner* — Duc Nguyen
*Assistant Examiner* — Matthew Eason
(74) *Attorney, Agent, or Firm* — Wayne Edward Ramage; Baker Donelson

(57) ABSTRACT

A loudspeaker system for the reproduction of acoustic waves of music, sound and speech in a substantially circular horizontal plane. The loudspeaker system includes multiple spherical enclosures, each enclosure housing a pair of transducers, each pair of transducers producing acoustic waves of a predetermined frequency range.

10 Claims, 7 Drawing Sheets

SPHERICALLY HOUSED LOUDSPEAKER SYSTEM

This application is a continuation of, and claims benefit of and priority to, U.S. patent application Ser. No. 11/324,649, filed Jan. 3, 2006,now U.S. Pat. No. 7,796,775, by J. Craig Oxford, et al., and is entitled to that filing date for priority. The specification, figures and complete disclosure of U.S. application Ser. No. 11/324,649 are incorporated herein by specific reference for all purposes.

TECHNICAL FIELD

The present invention involves a loudspeaker system for the reproduction of acoustic waves in music, sound and speech. Unlike traditional loudspeaker systems, the present invention houses various transducers in spherical enclosures to produce acoustic waves in substantially circular horizontal planes, each spherical enclosure houses a pair of transducers to produce acoustic waves in a predetermined frequency range.

BACKGROUND OF THE INVENTION

Traditional loudspeakers, particularly those intended for employment in home two channel audio or multi-channel theater systems employ rectangular enclosures and transducers which direct acoustic energy towards an intended listening position. There are, however, a number of loudspeaker designers that have suggested the generation of non-directional radiation from a loudspeaker. The reason for this is the recognized advantages which are known to be achievable as a result of an improved relationship between room acoustics and the loudspeaker itself. Specifically, when acoustically reflective surfaces in a room such as its walls and ceiling are excited with the same sound that reaches a listener directly, the reverberant or reflected sound does not interfere with the perceptual functioning of the listener. A loudspeaker which would feature various kinds of box enclosures cannot accomplish this because of diffractions which appear about the speaker enclosures. These diffractions modify the off-access sounds which are the ones that excite room reverberations. As such, a listener is provided with a more satisfying audio experience when a loudspeaker is employed which radiates isotropically, or in all directions. Nevertheless, there are practical advantages in producing a loudspeaker which is slightly anisotropic by restricting radiation to a mainly circular pattern in a horizontal plane and being slightly attenuated above and below that plane.

Loudspeaker systems such as those described herein achieve desired mild anisotropy and offer further advantages as well. The use of spherical enclosures minimize diffractions around those structures while providing a novel appearance. The use of driver elements in opposed pairs as suggested herein cause reactive forces to be completely contained and thus prevent undesirable transmission of those acoustic waves or forces to surrounding structures, particularly the floor upon which a loudspeaker is placed.

It is thus an object of the present invention to provide a speaker system in a form of spherical enclosures each housing tiers of audio transducers of specific frequency ranges thus eliminating those various types of box enclosures of the prior art.

It is yet a further object of the present invention to provide an improved loudspeaker system that fundamentally radiates acoustic energy isotropically with mild anisotropy, restricting radiation in a mainly circular horizontal plane and slightly attenuated above and below that plane.

These and further objects will be more readily appreciated when considering the following disclosure and appended drawings.

SUMMARY OF THE INVENTION

The present invention involves a loudspeaker system for reproduction of acoustic waves for music, sound and speech in a substantially circular horizontal plane, said loudspeaker system comprising multiple spherical enclosures, each enclosure housing a pair of transducers, each pair of transducers reproducing acoustic waves of a predetermined frequency range. Ideally, three such spherical enclosures are employed in producing a full range loudspeaker system. These enclosures would include a relatively large sphere enclosing a pair of low-frequency transducers upon which is positioned a smaller sphere housing opposed pairs of mid-range frequency transducers and located thereupon, a smaller spherical enclosure housing an opposed pair of high-frequency transducers

DETAILED DESCRIPTION OF THE INVENTION

Figure 2:
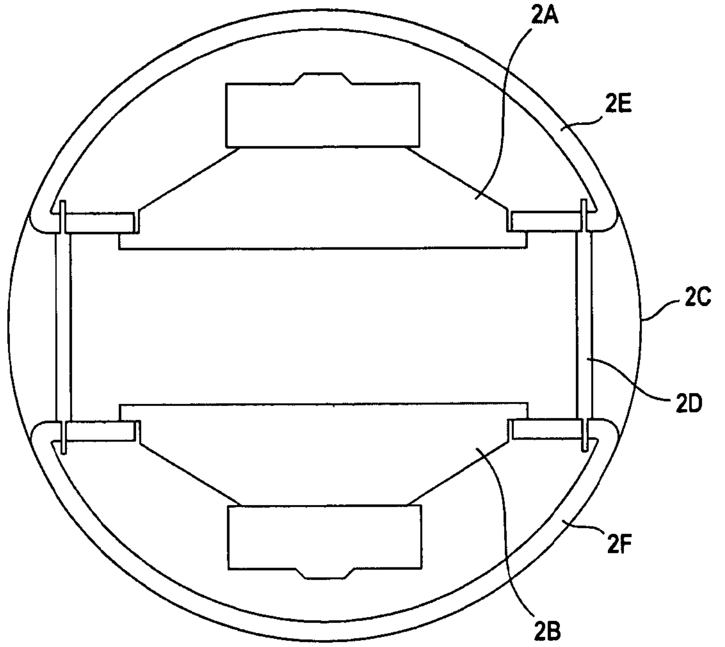
FIG. 2 and FIG. 3 are schematic illustrations of the low-frequency or woofer enclosure housing low-frequency transducers as contemplated for use in the present invention.
Figure 3:
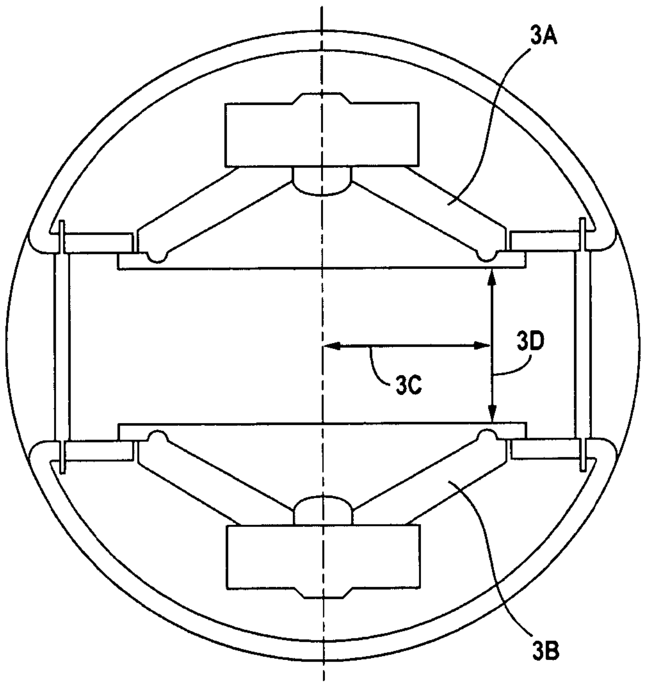

Turning first to FIGS. 2 and 3, relatively large spherical enclosure composed of lower hemisphere 2F and upper hemisphere 2E is shown to enclose low-frequency driver units 2A and 2B. Opposed driver units 2A and 2B ideally operate in phase with each other causing a pressure wave to emanate from the “equator” of the sphere. The upper and lower hemispheres 2A and 2F, composed of, for example, fiberglass, carbon fiber, spun metal or molded polymers further can include an acoustically transparent grill 2C, common to traditional loudspeaker designs traditionally referred to as a “grill cloth.” As noted, low-frequency loudspeaker transducers, 2A and 2B are mounted in the structural hemispheres which, themselves, are spaced apart by spacers 2D preferably located in three positions, 120° apart from one another in polar view. Typically, this enclosure would have a diameter of, for example, 20 or so inches.

FIG. 3 has been included in the present description in order to further illustrate low-frequency transducers 3A and 3B in order to show the diaphragms of each transducer. As a design requirement, it is noted that the active area of a low-frequency transducer diaphragm is approximately bounded by the mid point of the outer suspension or surround noted by radius 3C. The area of the cylinder whose radius is 3C and whose height is 3D must be equal or greater than the sum of the areas of the two diaphragms, specifically, $$(3C\times 2\pi\times 3D)\geqq(3C\times 3C\times 2\pi)$$

wherein:

3C=The radial distance between the geometric center of each speaker and the circumference of each speaker diaphragm as it is connected to each structural surround;

3D=The distance between opposing diaphragms measured at their circumference.

As is further quite apparent by viewing FIGS. 2 and 3, hemispheres 2E and 2F present completely closed surfaces behind each of the opposed low-frequency transducers. Those skilled in the loudspeaker art certainly appreciate the requirements of low-frequency transducers' small-signal parameters and/or the application of external equalization. The mutual coupling of the low-frequency transducers will result in measured parameters somewhat different from calculated values. Typically, the system resident frequency $F_{tc}$ and total Q, $Q_{tc}$ will both be lower than expected. Further, the opposed mounting of low-frequency transducers 2A and 2B with their in-phase operation causes the entire reaction force to be coupled through spacers 2D. Thus, there is no need to absorb reaction forces external to the low-frequency transducer system.

Wires connecting an external source with low-frequency transducers 2A and 2B can be introduced to low-frequency enclosure 100 (FIG. 1) through base 400 at its "south pole" and through its "north pole" to the "south pole" of mid-range frequency transducer enclosure 200 and on to high frequency transducer enclosure 300.

Figure 4:
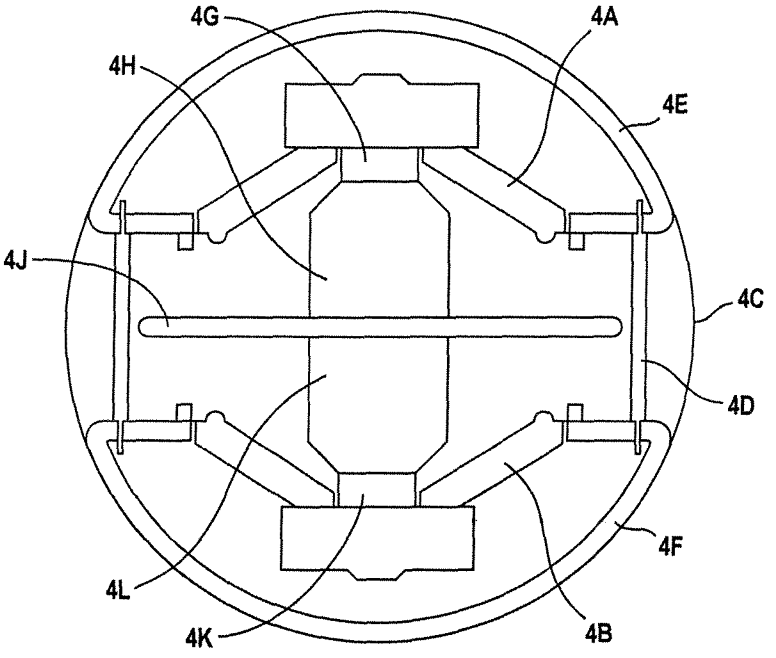
FIG. 4 is a schematic illustration of an enclosure and contained mid-range frequency transducers and supporting structure for use in the present invention.

Being a multi-transducer system and one intended to embrace the entire audio spectrum, the present system is also intended to include mid-range sphere 200 (FIG. 1) shown in detail in FIG. 4 as upper hemisphere 4E, lower hemisphere 4F and acoustically transparent grill cloth or covering 4C. As to scale, if low frequency or woofer sphere 100 was 20 to 21 inches in diameter, mid-range sphere 200 would be approximately 8 to 9 inches in diameter.

As background, it is generally understood that providing suitable mid-range frequency transducers for use herein is a more complicated matter than is the case in designing the appropriate low-frequency portion of the present system. In that wave lengths are much shorter, mid-range frequency transducers cannot be viewed as simple sources of acoustic waves. In acoustics, a simple source is one where ka is less than 1 noting that ka is the wave number times the diaphragm radius. The wave number is 2π F/C where F is frequency in Hz and C is the speed of sound and air, 345.45 m/s at sea level at 25° Celsius. If the diaphragm radius is 2 inches (0.051 m), ka equals 1 at 1082 Hz. Thus, the radiation from the driver ceases to be nondirectional beyond about 1 kHz.

In continuing with the appropriate placement of mid-range frequency transducers as an opposed pair shown in FIG. 4, acoustic wave emission must be substantially uniform on the radius, not axis of the mid-range frequency transducers. Below ka=1, this occurs naturally. Above ka=1, guidance can be taken from the expression for radiation from a piston in a plane which is a good approximation given the mid-range frequency transducer mounting as shown in FIG. 4 as follows:

$$R\propto=[2J_1(ka)\sin\propto]/ka\sin\propto$$

wherein:

R∝=The linear scale response function at an angle or away from the axis of the piston (or diaphragm)

k=The wave number=2π/λ

λ=wavelength=c/f f=frequency (Hz)

c=speed of sound in air=345.45 m/s a=radius of the piston or diaphragm (m)

$J_1$=first order Bessel function of the first kind

If R∝ (on axis so ∝=0 degrees)=1, the relative response in dB is given by 20 log R∝.

On the radius, the expression simplifies to R∝=[2$J_1$(ka)]/ka because sin 90°=1.

At ka=3.8, R∝=0, f=4096 Hz

To illustrate this matter further, it is contemplated that sphere 200 emanates mid-range frequency output from about 100 Hz to about 4 kHz. The existence of a null response at 4 kHz deforms the frequency response down to about 2 kHz because the response is falling down the asymptote into the null. In order to confine the null to a usefully higher frequency, it would be necessary to reduce the diaphragm radius to 1 inch (0.025 m). Such a small transducer cannot be used to the desired lower limit of 100 Hz because it cannot radiate sufficient acoustic power at that frequency. In order to overcome this issue to ameliorate the null while retaining the radiating area of a usefully large diaphragm, it is first necessary to intuitively understand why the null occurs.

A visual way of looking at why a null occurs is that from any radial point of observation, sounds originating from the near part of the diaphragm and those originating from the far part will destructively interfere with each other at certain wave lengths. It follows that if the "view" of the far side of the diaphragm can be obstructed, then the interference would be reduced or eliminated. Actual measurements show that this is the case.

Turning back to FIG. 4, the use of an obstacle positioned between the opposed pair of mid-range frequency transducers works well to minimize or eliminate the null. In this illustration, two obstacles are shown, namely, obstacles 4H and 4L. They can be conveniently supported by mounting them directly to the center poles 4G and 4K of the transducers. The optimum diameter of the obstacles is not arbitrarily selected. If the obstacles are small compared to the wave length of acoustic energy being emitted from the mid-range frequency transducers, its effect is negligible. Even so, it causes the diaphragms 4A and 4B to resemble ring sources. The expression for ring source's response function is $$R\propto=Jo(ka)\sin\propto$$

wherein:

Jo=the zero Bessel function of the first kind

As previously noted, on the radius, sin 90°=1. R∝=0 at ka=2.4 (however, the value of "a" must be determined). Assuming an outer diameter of the diaphragm d1, and an obstacle diameter d2, the diameter of the apparent ring source, d3=(d1+d2)/2. The obstacle will become significantly large as this diameter exceeds λ/4. If λ coincides with the null frequency in the response function, the obstacle will ameliorate the null. There thus exists an optimum relationship between the diameter of the obstacle, d2, and the diameter of a diaphragm, d1. Further, an iterative calculation will show that for the obstacle diameter to be safely equal to λ/2 at the null frequency, d2=0.0486×d1. To continue with this example, if d1=0.102 m and d2 equals 0.0496 m then the apparent ring source diameter, d3, would=0.0758 m. Thus, a=0.0379 m, the radius of the equivalent ring source. At ka=2.4, λ=0.0992 m, and d2=λ/2. In fact, measurements have shown that the null is eliminated and that the final response is within a conveniently equalizable range. This enables a geometry to exist per the illustration shown in FIG. 4 while achieving highly desirable mid-range frequencies emanating from the air created by spacers 4D which are positioned, ideally, 120° from each other employing 3 about the entire circumference of sphere 200 behind grill cloth 4C.

It is also proposed that separator 4J be employed. This is preferably made of a semi-rigid material which is acoustically non-reflective, such as Poron® to prevent reflections between the diaphragms 4A and 4B of the mid-range frequency transducers. The diameter of the separator can be slightly less than the diameter of the mounting circle of the three spacers, 4D.

As with the low frequency transducer section housed within sphere 100, individual hemispheres 4E and 4F enclose the back of each mid-range frequency transducer diaphragm 4A and 4B. Those skilled in the art of acoustic engineering will fully appreciate requirements of small-signal parameters to suit available closure volumes.

Figure 1:
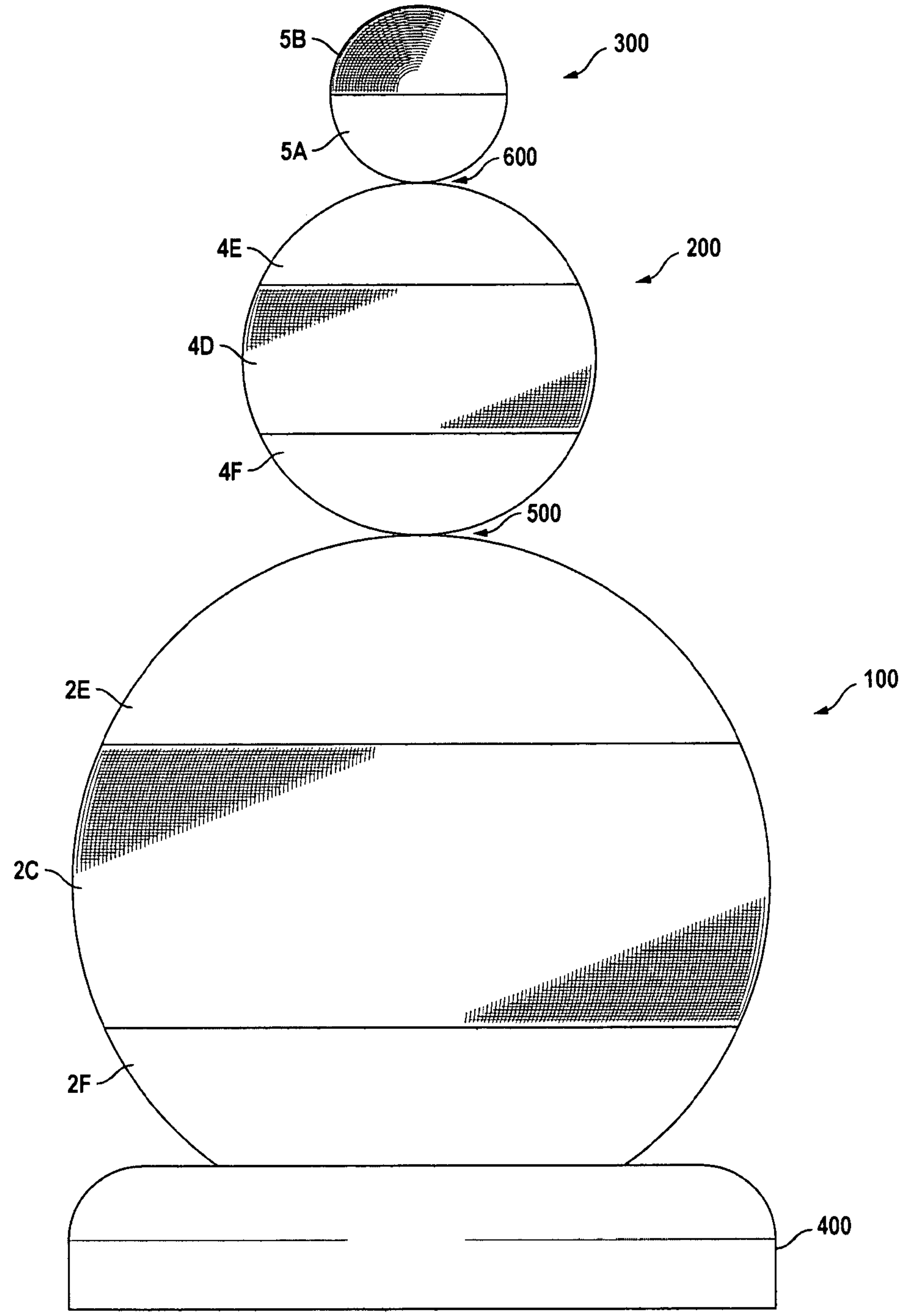
FIG. 1 is a side perspective view of the enclosures of a typical loudspeaker system of the present invention.
Figure 5:
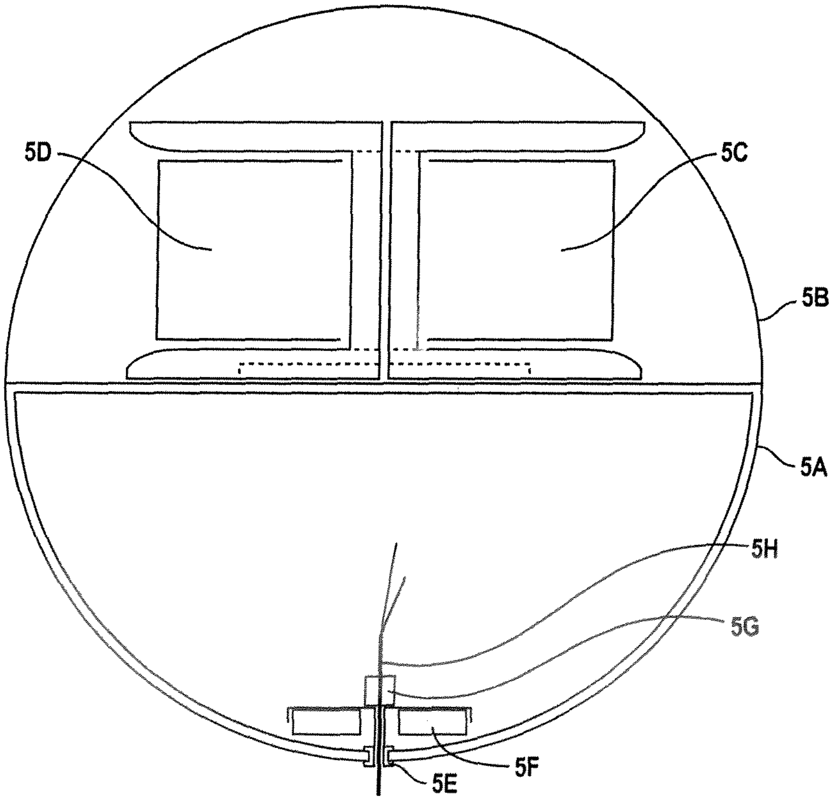
FIGS. 5 and 6 are schematic illustrations of a spherical enclosure, contained high-frequency transducers and supporting structure all for use in the present invention.
Figure 6:
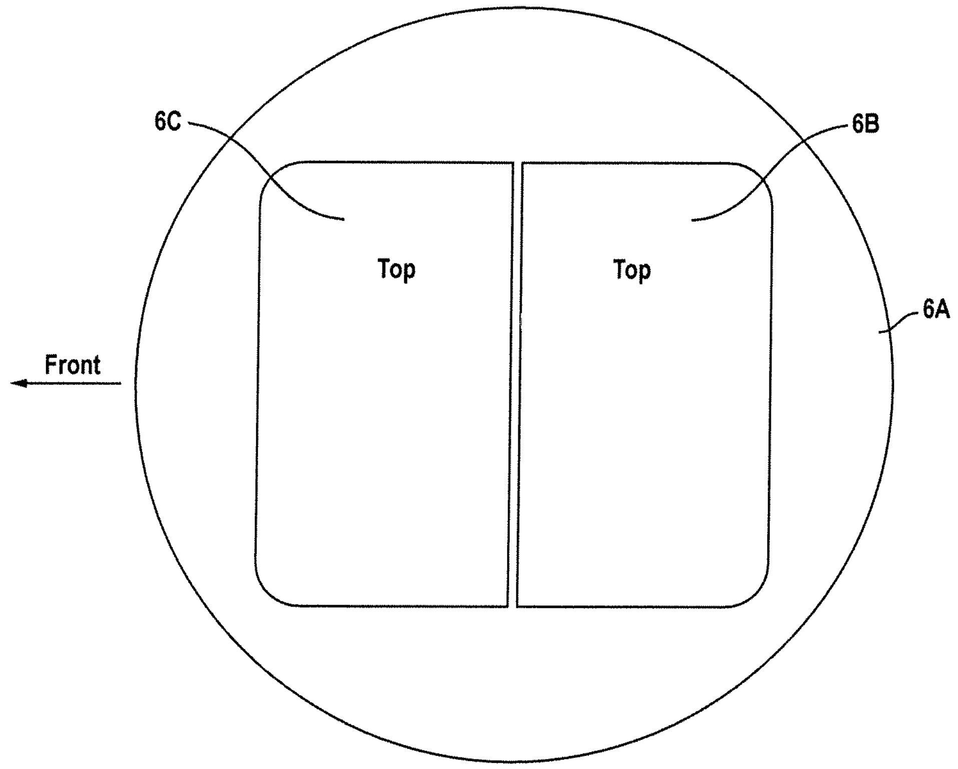

To complete the full range system contemplated herein, reference is made to FIGS. 5 and 6 showing the details of high frequency transducers to be included within sphere 300 (FIG. 7). In this instance, lower hemisphere 5A serves to support high frequency transducer pair 5C and 5D. Upper hemisphere 5B is intended to be substantially acoustically transparent comprised of, for example, acoustically "transparent" grill cloth commonly used in loudspeaker fabrication. The use of these upper and lower hemispheres visually completes the audio loudspeaker system as shown in FIG. 1.

Although there are a number of choices for the pair of opposing high-frequency transducers for use herein, one ideal choice would be the high frequency transducers disclosed in U.S. Pat. No. 6,061,461, the disclosure of which is incorporated by reference. Such high frequency transducers include a rigid frame and permanent ring magnet mounted to the frame. A small bobbin, preferably formed of aluminum foil, is sized and arranged to fit within the open end of the magnetic gap while permitting motion of the bobbin therein. A voice coil is wound on the bobbin and connectable to receive an audio signal, similar to a conventional voice coil driver system. A pair of flexible, curved diaphragms, shown in FIG. 5 are disposed on a frame, generally free to move except for their distal ends which are fixed at the frame. The diaphragms can be generally cylindrical or partial-cylindrical. Again, such a configuration is shown in U.S. Pat. No. 6,061,461, although other more conventional tweeter pairs can be used herein.

As with the mid-range frequency and low frequency transducer assemblies described above, the use of opposing pair of high frequency transducers again causes all of the reaction forces to be locally contained.

For clarity, FIG. 6 shows a suitable high frequency transducer sphere from a top view. In this instance, 6A is the top of the lower hemisphere, that is, the surface upon which the high frequency transducers are mounted and the two high frequency transducers are depicted as 6B and 6C.

Turning now to FIG. 1, there are a number of ways in which spheres 100, 200 and 300 can be mechanically and electrically joined in order to produce a functional loudspeaker system upon base 400. As shown in FIG. 1, low frequency transducer sphere 100 can be flattened on its "south pole" end to reside upon base 400. Suitable input connectors from a power amplifier and a cross over network to direct acoustic energy of specific frequencies to the low frequency, mid-range frequency and high frequency transducers can be also placed within base 400 or adjacent thereto. Alternatives to mounting or otherwise placing mid-range frequency transducer sphere 200 upon low frequency transducer hemisphere 100 at interface 500 as well as high frequency transducer sphere 300 upon mid-range frequency transducer sphere 200 at interface 600 will now be described. In this regard, reference is made to FIGS. 7A and 7B.

Figure 7A:
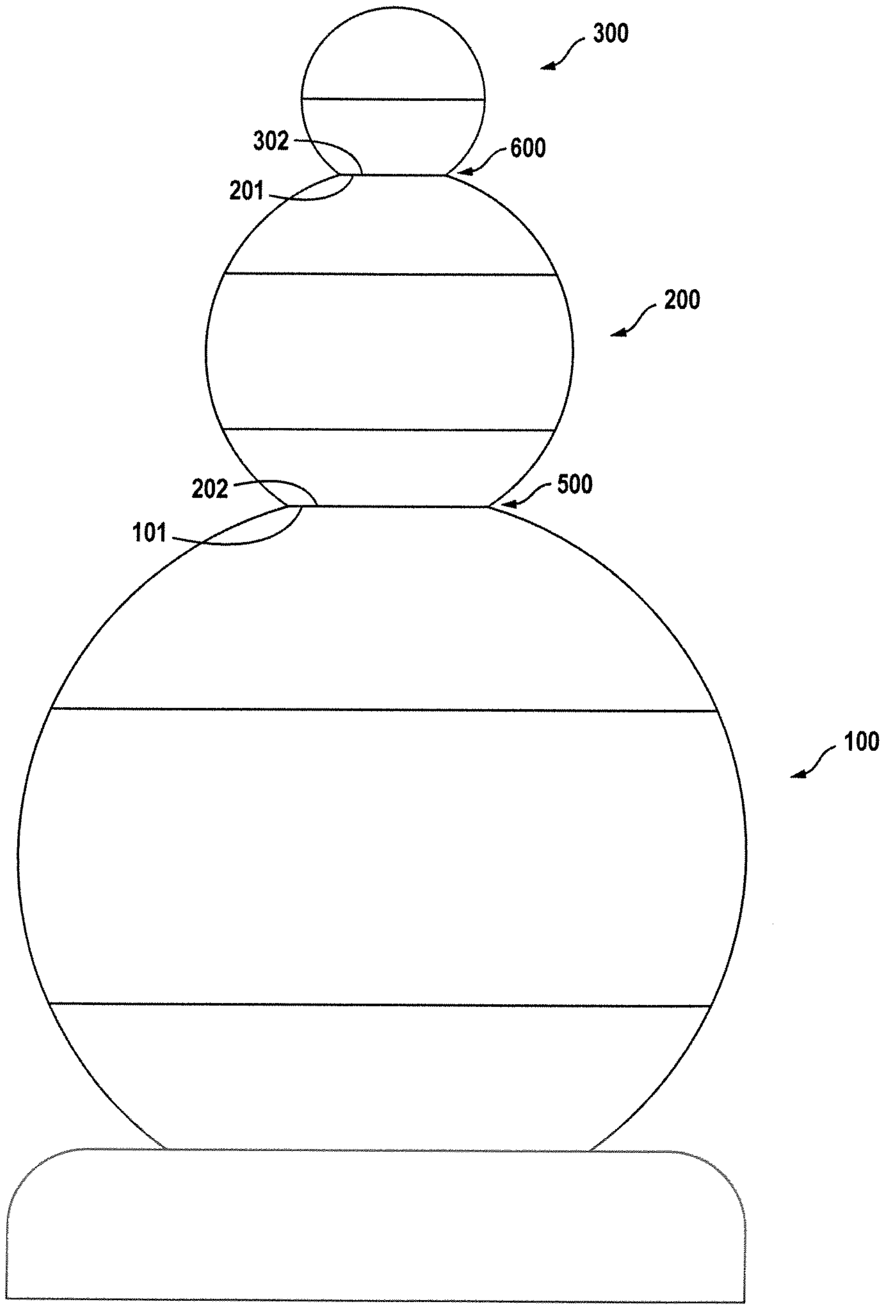
FIGS. 7A and 7B are front plan views of the external housing of the present loudspeaker system showing alternative ways in which the sub-enclosures interface with one another.

Turning first to FIG. 7A, it is noted that low frequency transducer hemisphere 100 is employed as a support for mid-range frequency transducer hemisphere 200 which is in turn employed to support high frequency transducer hemisphere 300. In order to stabilize this structure, low frequency transducer hemisphere 100 is somewhat flattened at its "north pole" 101 which mates with mid-range frequency transducer hemisphere 200 at its "south pole" 202 at interface 500. Similarly, mid-range frequency transducer hemisphere 200 is flattened at its "north pole" 201 which mates with the "south pole" 302 of high frequency transducer hemisphere 300 at interface 600. Appropriate cabling to provide electrical connections between the various transducers can enter and exit the various hemispheres in these flattened regions. The details of a suitable arrangement is shown in FIG. 5 wherein a cable entry arrangement is shown at 5E allowing entry of cables 5H emanating from mid-range frequency transducer hemisphere 200 to high frequency transducer hemisphere 300.

Figure 7B:
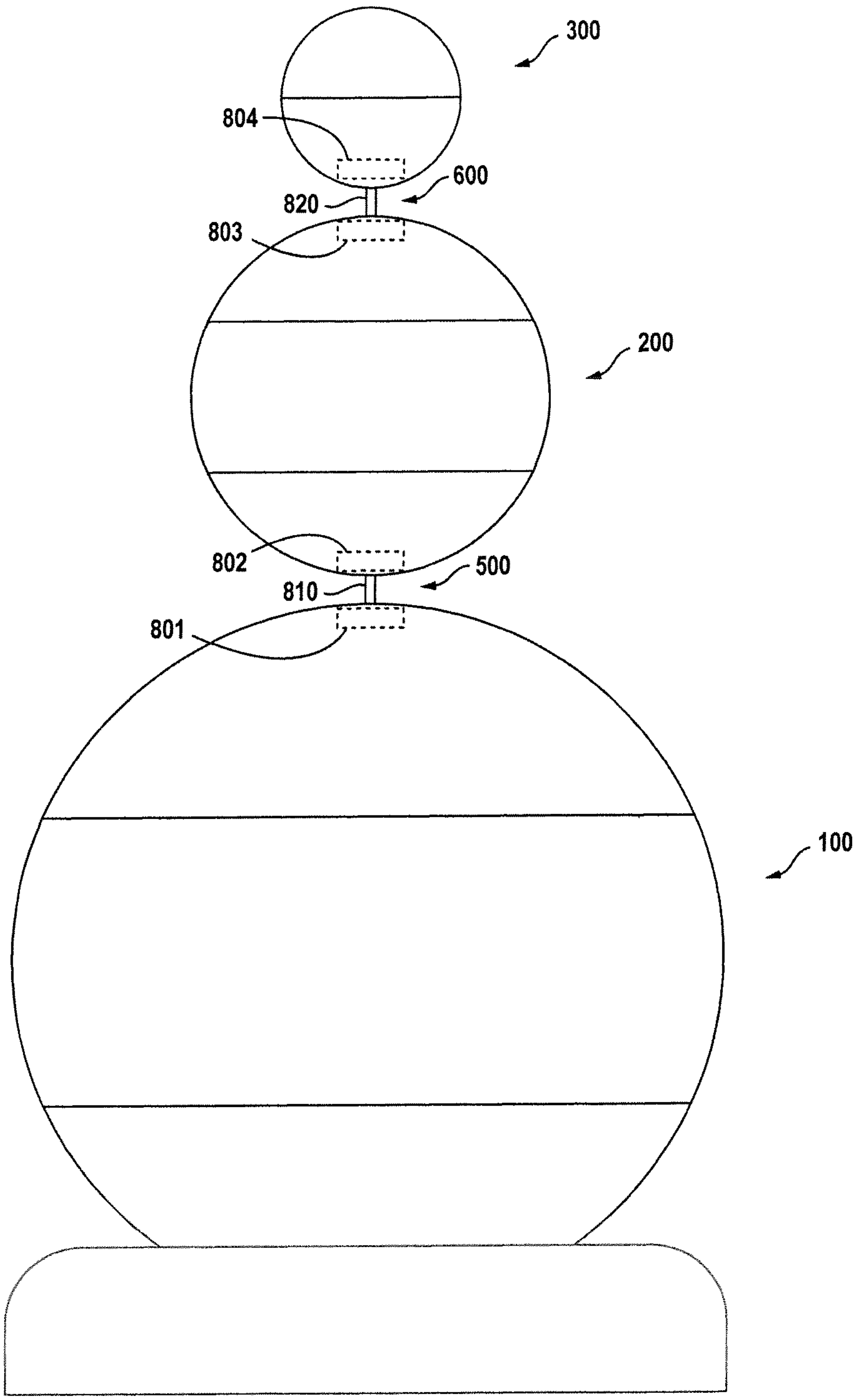

As an alternative, reference is made to FIG. 7B. In this instance, low frequency transducer hemisphere 100 can be fitted, at its "north pole" with a suitable magnet 801. Opposing magnet 801 is magnet 802 located on the "south pole" of mid-range frequency transducer 200 at interface 500. Similarly, a suitable magnet 803 can be situated at the "north pole" of mid-range frequency transducer hemisphere 200 opposing magnet 804 located on the "south pole" of high frequency transducer hemisphere 300 at interface 600. A typical ring magnet employed for this purpose is shown as 5F in FIG. 5. These magnets are intended to be magnetized longitudinally with the same pole of each magnet opposing its companion magnet. For example, magnet 801 would have its south pole facing upwards while magnetic 802 has its south pole facing downwards. This will cause the magnets to repel one another and result in mid-range frequency transducer hemisphere 200 to magnetically levitate above low frequency transducer hemisphere 100 and below high frequency transducer hemisphere 300. Cabling 810 and 820 can be employed to "tether" the various hemispheres to one another.

It should be apparent that a speaker system could be configured to combine the physical structures of FIGS. 7A and 7B. For example, mid-range frequency transducer hemisphere could be flattened at its "south pole" to enable it to physically reside upon low frequency transducer hemisphere 100 while appropriate magnets are located at the "north pole" of mid-range frequency transducer hemisphere 200 and the "south pole" of high frequency transducer hemisphere 300 to enable the latter to seemingly levitate in space.

Although the present invention, to this point, has suggested the use of three hemispheres housing low frequency, mid-range frequency and high frequency transducers, the present invention can also be employed in other ways while achieving its intended sonic benefits. In this regard, reference is made to FIGS. 8 and 9.

Figure 8:
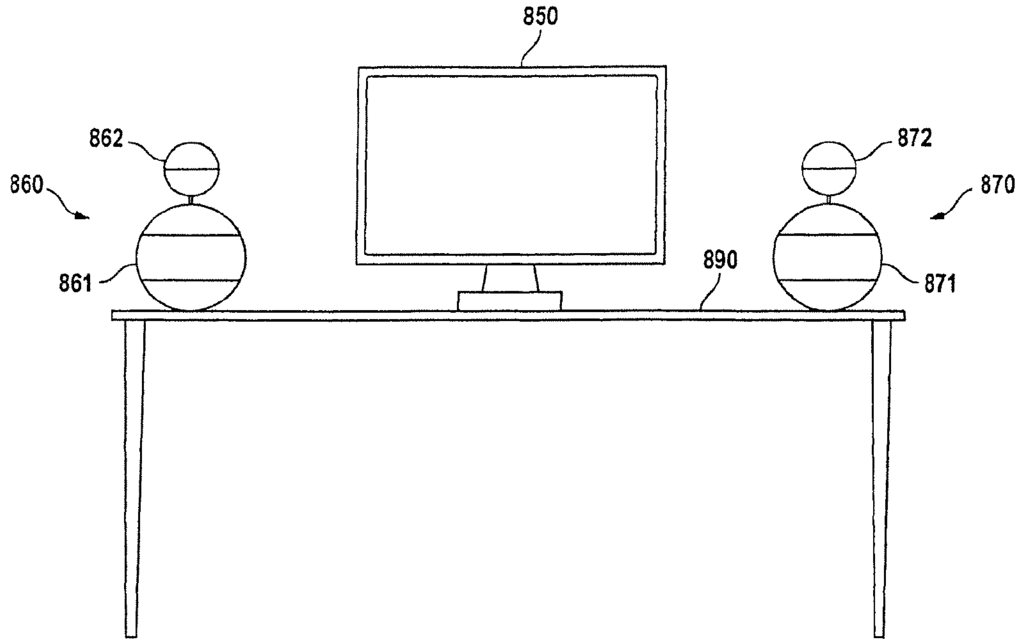
FIG. 8 is a side plan view of a typical computer monitor on a desk employing the present invention as the audio system connected thereto.

Turning first to FIG. 8, computer monitor 850 is shown being supported on table 890 in a typical residential installation. Computers, being more commonly employed as sources of acoustic input to satellite speaker systems, can now be used with speakers 860 and 870 wired to a desk top or lap top computer.

In that most computer installations, particularly those employed in residential environments, value compactness, very few audio systems appended to computers are full range systems. As such, speakers 860 and 870 are employed with mid-range frequency hemispheres 861 and 871 and appended high frequency transducer hemispheres 862 and 872, respectively. In such an installation, it is generally not desirable to include low frequency transducers noting that, when properly configured, the mid-range frequency transducers housed in hemispheres 861 and 871 provide sufficient low frequency output to satisfy most computer users. Further, the acoustic benefits described above are readily achievable in the installation shown in FIG. 8.

Even when it comes to two channel or multi-channel home theater installations intended for use by serious audiophiles, it is not always necessary that a three hemisphere system such as that depicted in FIGS. 1, 7A and 7B be employed. For example, many audiophiles, either because of space considerations or for aesthetic reasons, install satellite-sub systems while achieving excellent music reproduction. In this regard, reference is made to FIG. 9 showing stands 911 and 921 supporting satellite systems 910 and 920.

Figure 9:
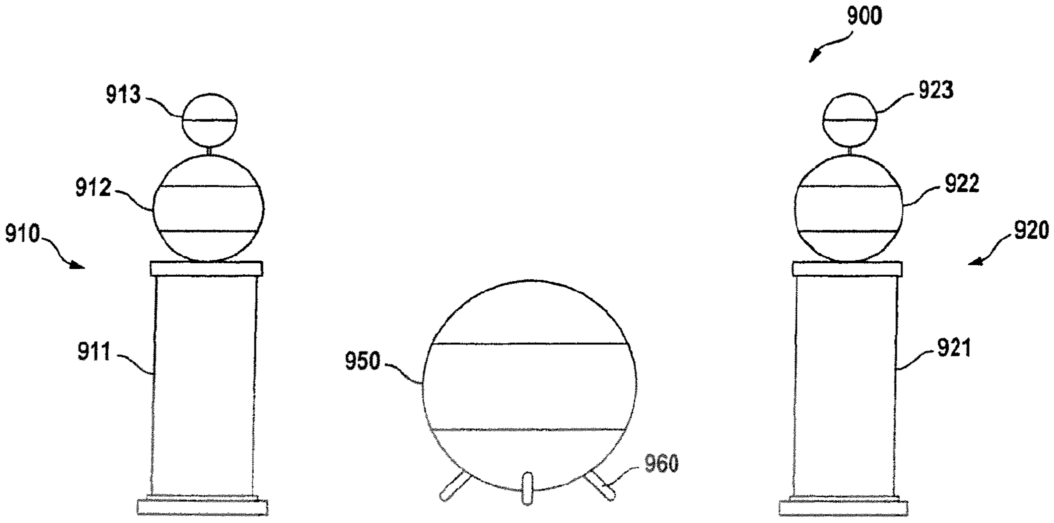
FIG. 9 is a plan view of a further iteration of the present invention employing it as a satellite-sub system commonly employed in residential installations.

A “two channel” system is shown in FIG. 9 whereby mid-range frequency transducer hemisphere 912 is provided in conjunction with high frequency transducer hemisphere 913 as the left channel and hemisphere 922 supporting high frequency transducer hemisphere 923 constitutes the right channel of this system. Because low frequencies loose their directionality, the low frequency acoustic energy produced in system 900 can be provided by centrally-located low frequency transducers within low frequency hemisphere 950. Alternatively, a pair of low frequency transducers housed in suitable low frequency transducer hemispheres could be placed adjacent to stands 911 and 912 to create two channel low frequency output in conjunction with the mid-range frequency transducer hemispheres and high frequency transducer hemispheres shown in FIG. 9. Further, low frequency transducers could be self powered by including an amplifier within or adjacent to low frequency hemisphere 950.

Lastly, where low frequency transducer hemisphere 100 of FIG. 1 was shown supported on a suitable base 400, as an alternative, any of the hemispheres described herein can be supported by legs or spikes 960 such as those depicted in FIG. 9. Such spikes could also be used to support mid-range frequency transducers hemispheres 912 and 922 upon bases 911 and 920 or upon table 890 (FIG. 8) while high frequency hemispheres 913 and 923 could either be caused to levitate above mid-range frequency transducer hemispheres 912 and 922, respectively, as discussed above or their interface surfaces could be flattened, again, as previously discussed.

The invention claimed is:

1. A loudspeaker system, comprising:

two or more fully spherical enclosures, each enclosure separately housing a pair of transducers, each pair of transducers positioned in opposition to each other and reproducing acoustic waves of a predetermined frequency range, wherein a first of said spherical enclosures comprises a woofer enclosure housing an opposed pair of low-frequency transducers operating in phase with one another, and a second of said spherical enclosures comprises an opposed pair of mid-range frequency transducers with at least one obstacle positioned between said opposed pair of mid-range frequency transducers;

further wherein said mid-range frequency transducers are comprised of substantially circular diaphragms supported by structural surrounds and centrally located pole pieces, said at least one obstacle being positioned in front of said pole piece of each mid-range frequency transducer; and further wherein said at least one obstacle is substantially of a circular geometry having a circular cross section and length, said obstacle being positioned such that its cylindrical cross section is positioned proximate said pole pieces and sized to substantially reduced inharmonic nulls which would otherwise occur radial to the axis of the obstacle in its absence.

2. The loudspeaker system of claim 1 wherein said woofer enclosure comprises an upper hemisphere and a lower hemisphere, said upper and lower hemispheres being separated by spacers for establishing a substantially horizontally oriented open region through which low-frequency acoustic waves emanate from said low-frequency transducers.

3. The loudspeaker system of claim 2 wherein said opposed pair of low-frequency transducers are oriented substantially vertically within said upper and lower hemispheres.

4. The loudspeaker system of claim 1 wherein said low-frequency transducers operate to reproduce acoustic waves below approximately 100 Hz and said mid-range frequency transducers operate to reproduce acoustic waves from approximately 100 Hz to approximately 4 KHz.

5. The loudspeaker system of claim 1 further comprising a separator positioned between said opposing mid-range frequencies transducers.

6. The loudspeaker system of claim 5 wherein said separator comprises a planar sheet of semi-rigid acoustically non-reflective material.

7. The loudspeaker system of claim 1 further comprising a third spherical enclosure housing an opposed pair of high-frequency transducers.

8. The loudspeaker system of claim 7 wherein at least a portion of said third spherical enclosure is substantially transparent to the passage of high-frequency acoustic energy.

9. The loudspeaker system of claim 7 wherein each high-frequency transducer comprises a frame supporting a pair of flexible, curved diaphragms that are free to move except for a distal end of each diaphragm which is fixed to the frame, said diaphragms being of generally cylindrical shape.

10. The loudspeaker system of claim 7 wherein the top most surface of said first spherical enclosure, the top most and bottom most surfaces of said second spherical enclosure and the bottom most surface of said third spherical enclosure are flattened to facilitate said third spherical enclosure to seat upon said second spherical enclosure and said second spherical enclosure to seat upon said first spherical enclosure.

* * * * *